(12) United States Patent
Inukai

(10) Patent No.: US 6,919,834 B2
(45) Date of Patent: Jul. 19, 2005

(54) CIRCUIT, DISPLAY DEVICE, AND ELECTRONIC DEVICE

(75) Inventor: Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/747,693

(22) Filed: Dec. 30, 2003

(65) Prior Publication Data

US 2004/0252040 A1 Dec. 16, 2004

(30) Foreign Application Priority Data

Jan. 6, 2003 (JP) ..................................... 2003-000672

(51) Int. Cl.$^7$ ............................................. H03M 1/66
(52) U.S. Cl. ..................................................... 341/144
(58) Field of Search ................................ 341/118, 120, 341/144, 136, 153, 154, 145; 307/352, 353, 491, 607; 328/151; 327/91, 94

(56) References Cited

U.S. PATENT DOCUMENTS 5,703,582 A * 12/1997 Koyama et al. ............ 341/120

2003/0156102 A1 8/2003 Kimura
2004/0135799 A1 7/2004 Shiomi et al.

FOREIGN PATENT DOCUMENTS

| JP | 11-282419 | 10/1999 |
|---|---|---|
| JP | 2001-147659 | 5/2001 |

* cited by examiner

Primary Examiner—Brian Young
(74) Attorney, Agent, or Firm—Fish & Richardson P.C.

(57) ABSTRACT

An object of the present invention is to provide a method for shortening a setting time of an analog current to be outputted in a DA converter circuit which reads in digital voltage value data and outputs analog current value data. The present invention can be used for a data driver circuit in an AM type OLED display device. The present invention provides a function of applying a constant voltage exceptionally in the case where data to be inputted takes a predetermined value for a current output DA converter circuit. Consequently, a setting time of an analog current to be outputted for low current data and the like can be shortened.

3 Claims, 9 Drawing Sheets

CIRCUIT, DISPLAY DEVICE, AND ELECTRONIC DEVICE

TECHNICAL FIELD TO WHICH THE INVENTION BELONGS

The present invention relates to techniques for a current output circuit and a DA converter circuit. In addition, the present invention relates to a display device and electronic equipment in which the current output circuit or the DA converter circuit are mounted.

PRIOR ART

The importance of a thin display device displaying images has continued to increase in recent years. As the thin display device, a liquid crystal display device displaying images by using a liquid crystal element is widely used as a display device for various kinds of applications including a portable telephone, a personal computer and the like, due to the advantages such as thinness, high image quality, and light-weight.

On the other hand, the development of a thin display device and a light emitting device using a light emitting element has also been advanced. Such light emitting element includes various kinds of elements over a wide range, such as an organic material, an inorganic material, a thin film material, a bulk material, and a dispersion material.

A typical light emitting element currently seen as promising for a thin display device is an Organic light emitting diode (OLED) element. An OLED display device using an OLED element is thinner and lighter than a conventional liquid crystal display device, and in addition, have characteristics such as high response speed suitable for a moving image display, a wide angle of view, and low voltage drive. Therefore, a wide variety of applications such as a portable telephone, a portable information terminal (PDA=personal digital assistant), a television, and a monitor are anticipated. The OLED display device is drawing attention as a next generation display.

In particular, an active matrix (AM) type OLED display device is capable of displaying images with fine-pitched or in a large size screen, which is difficult for a passive matrix (PM) type OLED display device. In addition, the AM type OLED display device has high reliability in an operation at lower power consumption than that of the PM type. Thus, the AM type OLED display device is strongly expected to be put into practical use. As the other advantage of the AM type OLED display device, by integrating driver circuits on a panel, a frame region of the panel can be narrowed, thus a display device with a high added value can be obtained.

The OLED element, which is generally structured by an anode, a cathode, and an organic compound containing layer sandwiched between the anode and the cathode, is a current-drive light emitting element. It is called the current-drive light emitting element because the brightness of light emitted from the OLED element is roughly proportional to the amount of currents flowing in the OLED element.

As a driving method for displaying images in the AM type OLED display device, a voltage input method and a current input method can be used. The voltage input method is a method of inputting a video signal of voltage value data to pixels as an input video signal. On the other hand, the current input method is a method of inputting a video signal of current value data to pixels as an input video signal. Generally speaking, the current input method is preferable for the AM type OLED display device.

The reason why the current input method is preferable is related to the problem on the display quality. In a pixel of the AM type OLED display device, a pixel drive transistor which controls the brightness of light emitted from the OLED element in a pixel is connected to the OLED element in series. That is the same in the voltage input method and the current input method. In the voltage input method, a voltage for a video signal is normally applied directly to a gate electrode of a pixel drive transistor. Therefore, if there is variation, not uniformity, in the electrical characteristics of the pixel drive transistors across each of the pixels when the OLED elements emit light at a constant current, variation will develop in a current for driving an OLED element of each of the pixels. The variation in the current for driving the OLED element becomes variation in the brightness of light emitted from the OLED elements. Since a sandstorm state or carpet-like pattern unevenness is seen over an entire screen, the variation in the brightness of light reduces the quality of the displayed image.

In particular, a polycrystalline silicon (polysilicon) TFT is normally used as the pixel drive transistor these days, for a sufficient current for emitting light with high brightness is not obtained by a non-crystalline (amorphous) thin film transistor. However, the polysilicon TFT has a problem in that variation in the electrical characteristics are likely to develop due to faults in the crystal grain boundaries and the like.

For the AM type OLED display device, the current input method is generally more suitable than the voltage input method, however, there are also problems. One of the problems is that the driver circuit for the current input method is comparatively complex compared with the voltage input method and it is more difficult to integrate over panel.

PROBLEM TO BE SOLVED BY THE INVENTION

A panel configuration of an AM type display device for a typical current input method is explained below with reference to FIGS. 7 to 9 and FIG. 4.

Figure 8:
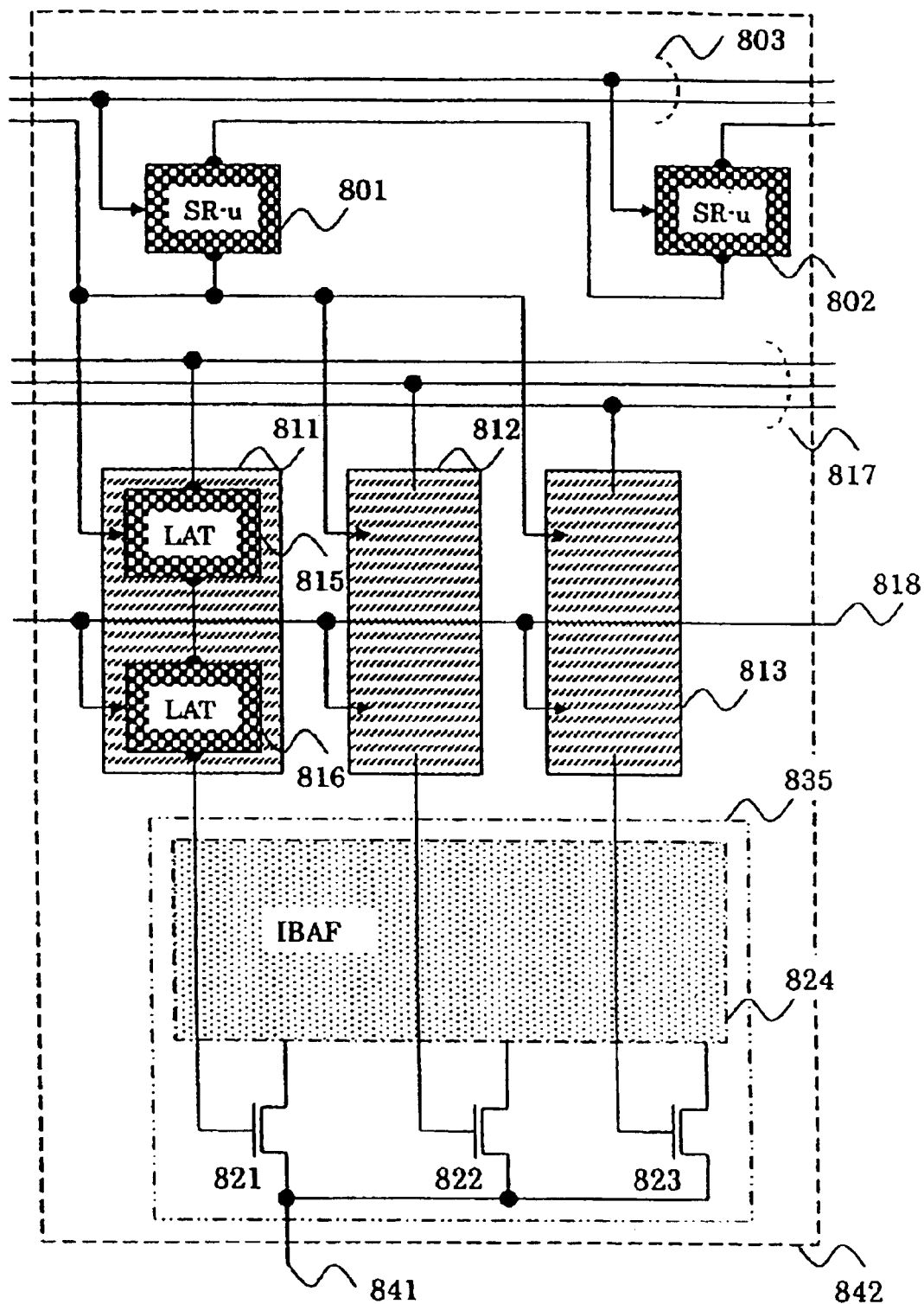
FIG. 8 is a diagram showing a configuration example of a data driver using a conventional DA converter circuit.
Figure 9:
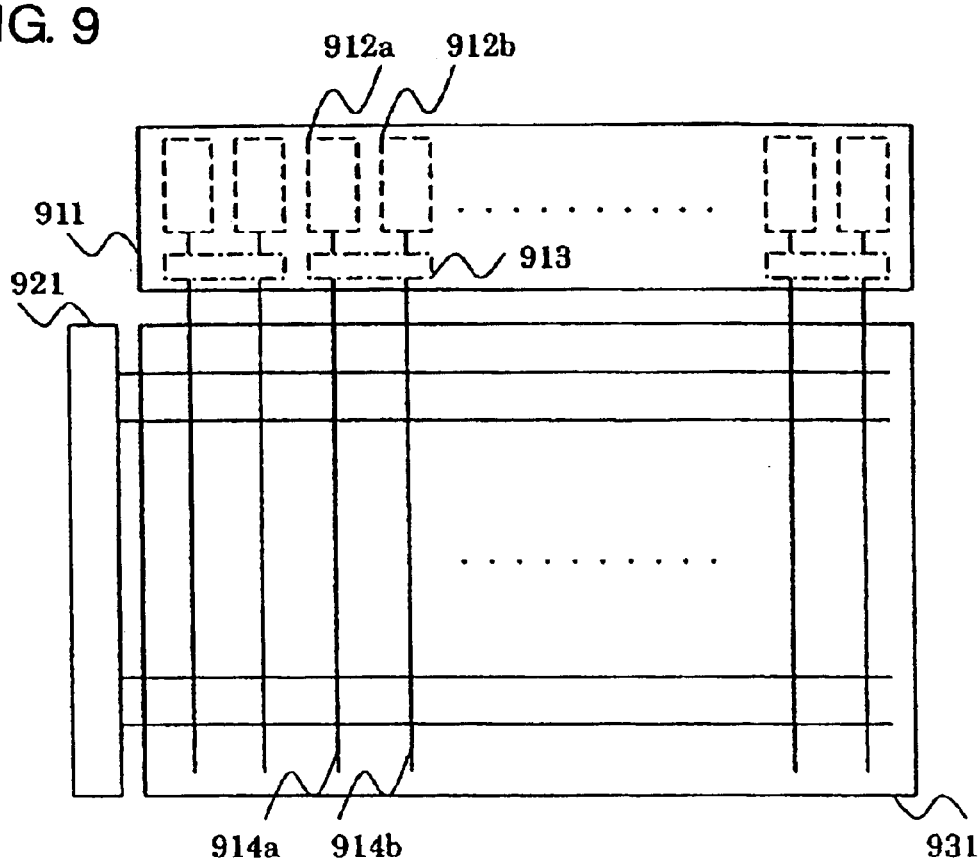
FIG. 9 is a diagram showing a panel configuration example of a display device.

FIG. 9 is a configuration diagram of an entire panel. In addition to a pixel portion 931 which has pixels disposed in matrix, a gate driver circuit 921 and a data driver circuit 911 are integrally formed over a panel in general. A one-dashed chain lined part 913 in the data driver circuit 911 denotes a selector circuit. Dotted lined parts 912a and 912b in FIG. 9 denote current data output circuits, whose configurations are shown by a dotted lined part 842 in FIG. 8. Reference number 841 denotes an output portion.

A current data output circuit shown in FIG. 8 is roughly divided into the following four parts: a shift register part, a digital data latch part, a current source (current output circuit), and a DA switch. The current source (current output circuit) and the DA switch jointly constitute a current output DA converter circuit.

Figure 4:
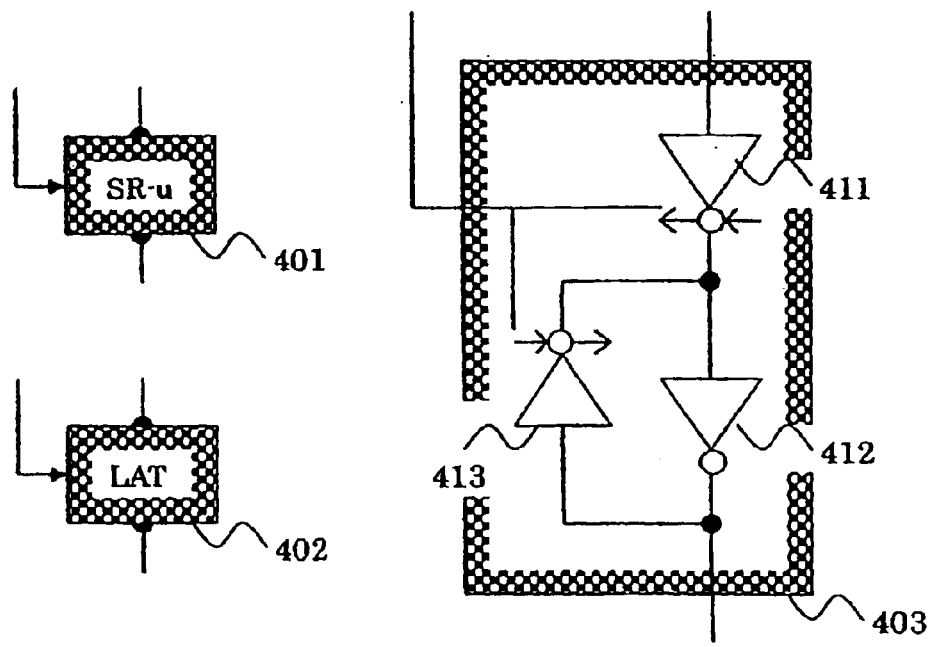
FIG. 4 are diagrams showing a configuration example of a latch circuit.

Reference numbers 801 to 803 correspond to the shift register part, 803 denotes clock and its inverted clock signal lines, and checker parts 801 and 802 denote circuits shown by 403 in FIG. 4. The shift register part output and generate a timing signal sequentially and in accordance with the timing signal, the digital data latch part read in video data (digital data) from data signal lines.

Reference numbers 811 to 818 correspond to the digital data latch part, 817 denotes data signal lines for each bit, 818 denotes a latch signal line, and checker parts 815 and 816 denote circuits shown by 403 in FIG. 4. In FIG. 8, there are three data signal lines on the assumption that video data (digital data) is of three-bit-constitution. The checker parts 815 and 816 in 812 and 813 are omitted from the figure. The video data (digital data) read in in accordance with the timing signal from the digital data latch part is transferred to the DA switches 821 to 823 in synchronism with a latch signal.

Figure 7:
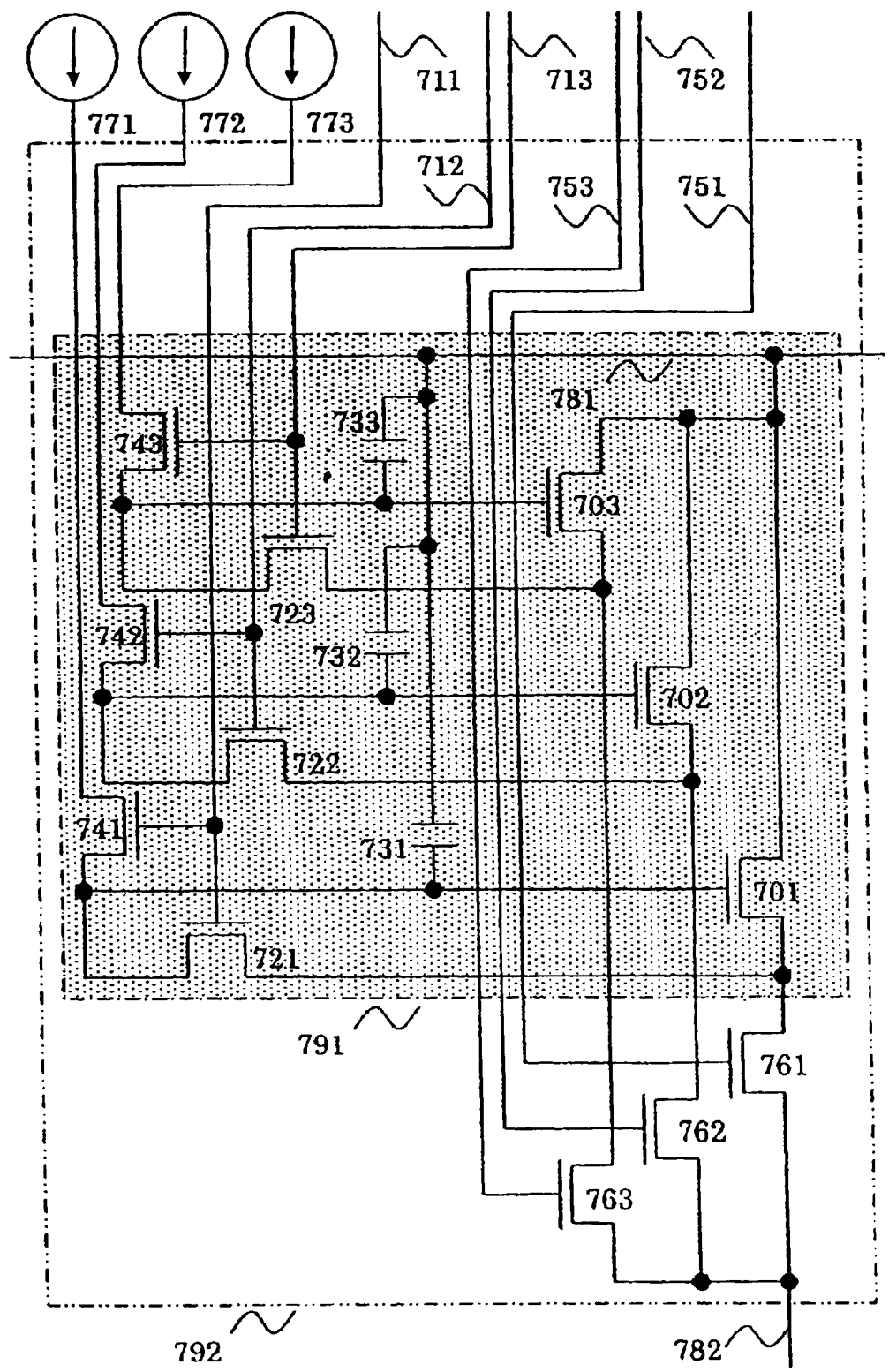
FIG. 7 is a diagram showing a current output circuit and a DA converter circuit.

A dotted part 824 corresponds to the current source (the current output circuit) and its specific circuit configuration is shown by a dotted part 791 in FIG. 7. The current source corresponding to each bit is provided independently. That is to say, a current source circuit configured with 701, 711, 721, 731 and 741 is completely independent of the current source circuit configured with 702, 712, 722, 732 and 742. Reference numbers 741 to 743 correspond to voltage source switches, reference numbers 771 to 773 correspond to a reference current sources, reference number 792 correspond to a current output DA converter circuit, and reference number 782 correspond to an output portion.

Reference numbers 821 to 823 correspond to the DA switches and are denoted by 761 to 763 in FIG. 7. The total current of the current sources of all the bits whose DA switch is in an ON state is finally outputted from the current data output circuit since the DA switches are disposed in parallel.

At the outside of the panel, it is the most convenient that video data is processed as digital voltage data. In view of the foregoing, the current output DA converter circuit in the current data output circuit shown in FIG. 8 is of significance. However, in the DA converter, needs to be set a current value for each bit individually, thus it makes the operation complex. In addition, an increase in the number of bits causes an increase in the number of input lines for setting current, makes the layout complicated, and enlarges the area of the layout.

At the outside of the panel, it is the most convenient that video data is processed as digital voltage data. In view of the foregoing, the current output DA converter circuit in the current data output circuit shown in FIG. 8 is of significance. However, the DA converter has a disadvantage in that when an analog current to be outputted is 0 or very small, for example, a long setting time is required.

An object of the present invention is to provide a method for shortening a setting time in a DA converter circuit which reads in digital voltage value data and outputs analog current value data. The present invention can be used for a data driver circuit which is used for an AM type OLED display device for a current input method.

Means for Solving the Problem

The present invention includes a current output DA converter circuit.

The current output DA converter circuit is preferably configured with a current output circuit comprising a plurality of drive transistors wherein a switch, whose ON/OFF operation is controlled corresponding to bit data, is provided for each drain. Note that, the present invention is not limited to this configuration. The current output DA converter circuit may include a current output circuit characterized by including a plurality of drive transistors wherein gate electrodes are electrically connected to each other and a switch is provided between the gate electrode and each drain of the plurality of drive transistors.

The current output DA converter circuit of the present invention has a function of applying a constant voltage exceptionally in the case where data to be inputted takes a predetermined value.

In addition, the present invention includes a display device and electronic equipment in which the current output DA converter circuit is used.

EMBODIMENT MODE OF THE INVENTION

Embodiment Mode 1

An embodiment of the present invention is explained below with reference to FIGS. 9, 3, 4 and 1. In this embodiment, a DA converter circuit of the present invention is used in a data driver circuit of an AM type OLED display device. 3-bit digital voltage value data is read in as video data here, however, needless to say, there is no limitation in the number of bits processed in the DA converter circuit of the present invention. Note that, it is possible to substitute a circuit shown in FIG. 2 or FIG. 7 for a circuit shown in FIG. 1.

FIG. 9 is a configuration diagram of an entire panel. A pixel portion 931 which has pixels disposed in matrix, a gate driver circuit 921 and a data driver circuit 911 are integrally formed over a panel. A one-dashed chain lined part 913 in the data driver circuit 911 denotes a selector circuit. Dotted lined parts 912a and 912b in FIG. 9 denote current data output circuits, whose configurations are shown by a dotted lined part 342 in FIG. 3.

First, this embodiment mode gives a description of the current data output circuit 342 (shown in FIG. 3), which corresponds to current data output circuits 912a and 912b and then of the selector circuit 913.

The current data output circuit 342 is divided into the following five parts: a shift register part, a digital data latch part, a current source (current output circuit), a DA switch and a voltage source switch. The current source (current output circuit) and the DA switch jointly constitute a current output DA converter circuit.

Reference numbers 301 to 303 correspond to the shift register part and 303 denotes clock and its inverted clock signal lines. The checker parts 301 and 302 comprise for example, a circuit 403 shown in FIG. 4. Note that, configurations of the checker parts 301 and 302 are not limited to the circuit 403. Other circuits can be substituted as long as they can implement the same functions.

The shift register part 301 to 303 output and generate a timing signal sequentially and in accordance with the timing signal, the digital data latch part read in video data (digital data) from data signal lines.

Figure 3:
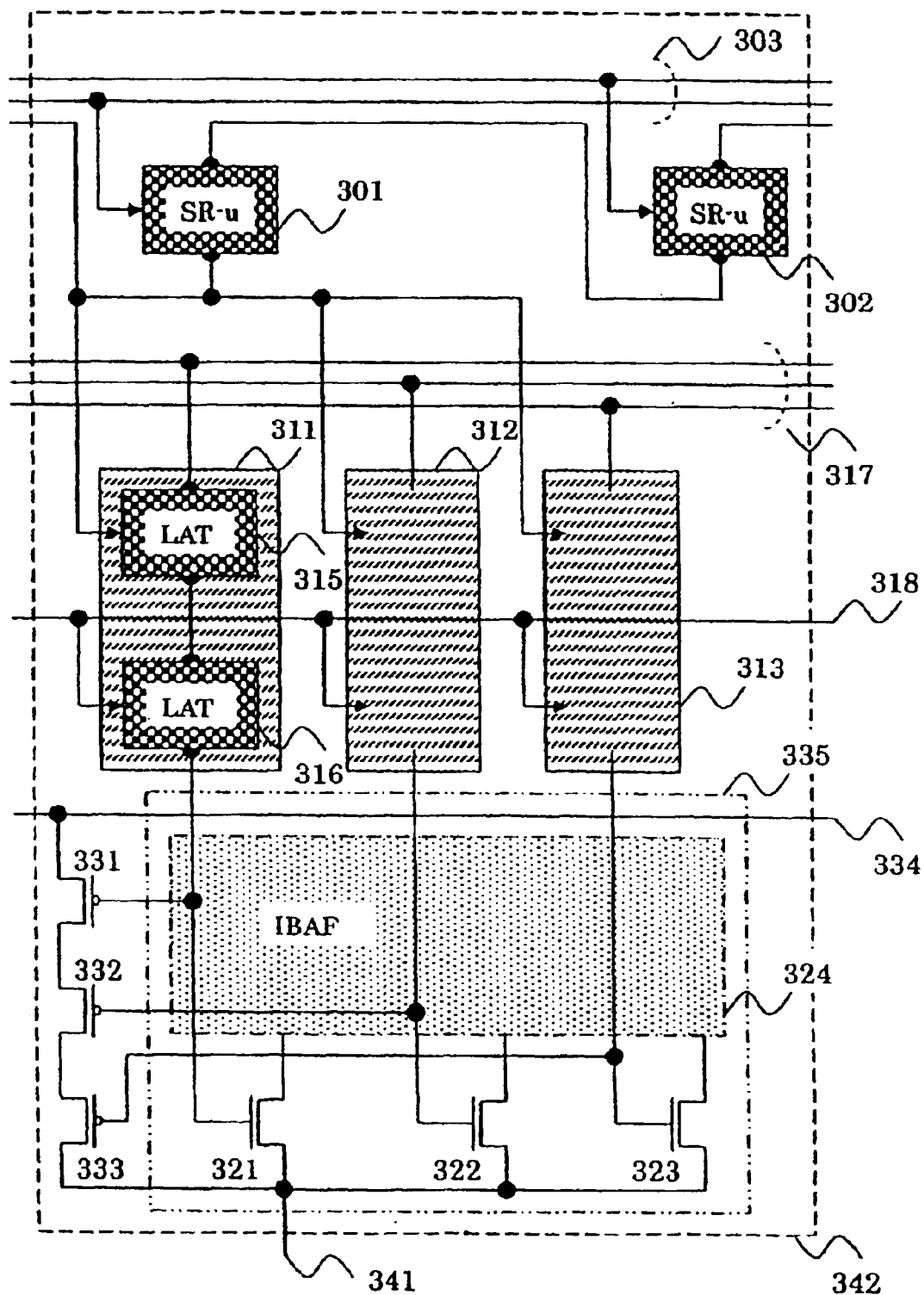
FIG. 3 is a diagram showing a configuration example of a data driver using a DA converter circuit of the present invention.

Reference numbers 311 to 318 correspond to the digital data latch part. 317 is data signal lines for each bit, and 318 is a latch signal line. Checker parts 315 and 316 can use the circuit 403 shown in FIG. 4. In FIG. 3, there are three data signal lines on the assumption that video data (digital data) is of three-bit-constitution. The checker parts 315 and 316 in 312 and 313 are omitted from the figure. The video data (digital data) read in in accordance with the timing signal from the digital data latch part is transferred to the DA switch 321 to 323 in synchronism with a latch signal.

Figure 1:
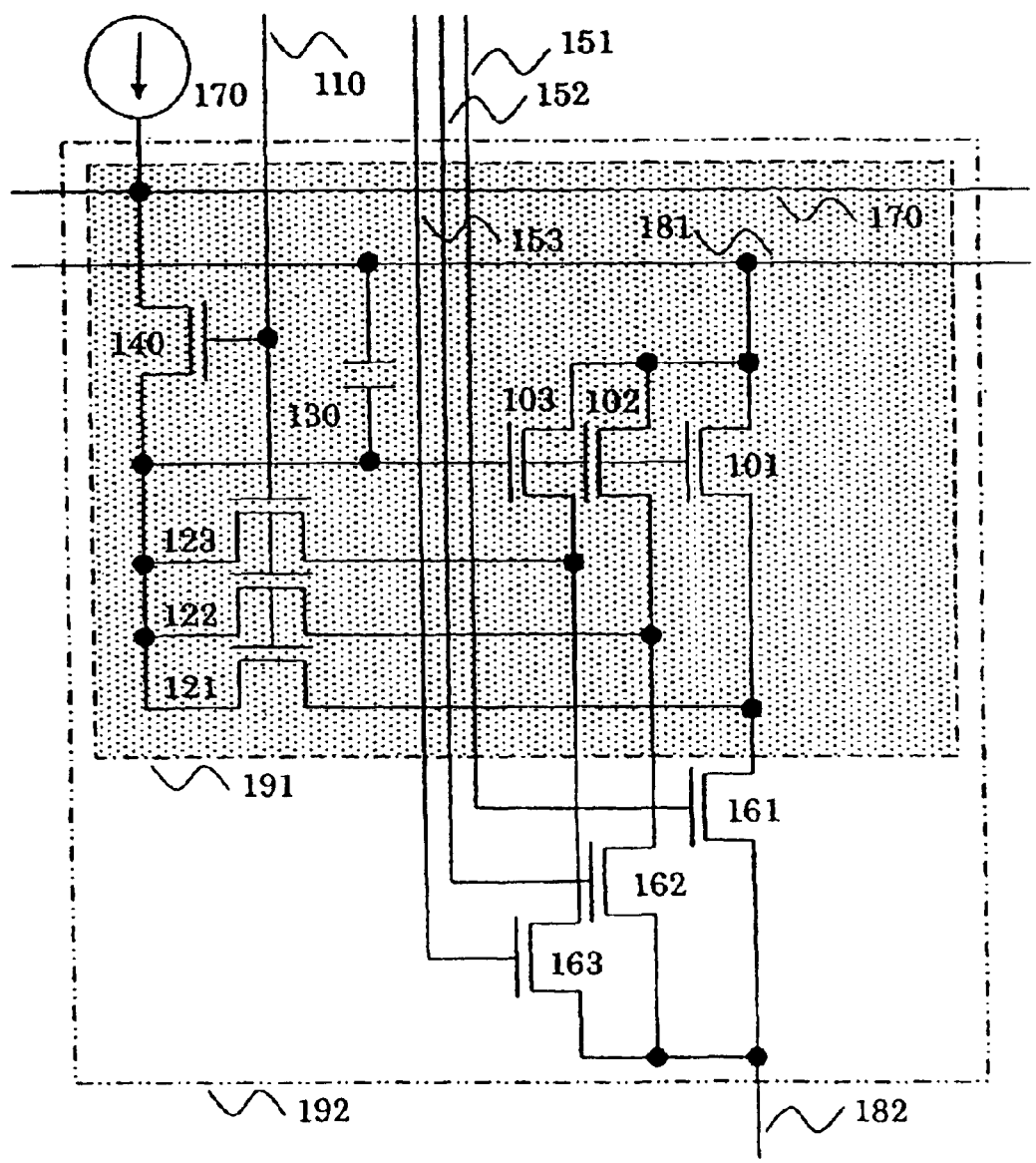
FIG. 1 is a diagram showing an example of a current output circuit and a DA converter circuit.

A dotted part 324 corresponds to the current source (current output circuit) and its specific circuit configuration is shown by a dotted part 191 in FIG. 1. Transistors 101 to 103 are drive transistors. Transistors 161 to 163 (shown in FIG. 1) denote the DA switch. The DA switch transistors 161 to 163 are denoted by 321 to 323 in FIG. 3.

In FIG. 1, the drive transistor corresponding to each bit is provided independently For example, it is supposed that a transistor 101 denotes the one for a first bit (MSB=most significant bit), 102 for a second bit, and 103 for a third bit (LSB=least significant bit) and that the L/W size ratio of the three transistors is roughly set at 1:2:4, respectively. However, since each gate electrode of the drive transistors 101 to 103 are electrically connected to each other, it makes possible to set reference currents at a same time. The circuit shown in FIG. 1 is different from the circuit shown in FIG. 7 in this point. Furthermore, the reduction in a circuit area can be achieved by the circuit shown in FIG. 1 since the circuit in has less transistors and wirings than the circuit in FIG. 7.

The operation for setting a reference current at a current source (current output circuit) shown in FIG. 1 is explained below.

For setting a reference current, signals which turn the DA switch transistors 161 to 163 OFF are inputted from digital signal input lines 151 to 153. In the case where the transistors 161 to 163 are n-channel types, Low (low voltage) signals are inputted. However, the transistors 161 to 163 are not required to be turned OFF in the case where there is no possibility of a current leaking from an output portion 182 such as a case where an end of the output portion 182 is electrically released (in high impedance).

Next, signals which turn transistors 121 to 123 and 140 ON are inputted from a current-setting signal input line 110. In the case where the transistors are n-channel types, Hi (high voltage) signals are inputted. Then, a reference current flows from a reference current source 170 to a constant voltage source 181. At this time, gates and drains of the drive transistors 101 to 103 are each short-circuited. Therefore, by inputting signals which turn the transistors 121 to 123 and 140 OFF from the current-setting signal input line 110 after the current reaches a stationary value, the reference current is stored as the gate voltages of the drive transistors 101 to 103.

The setting of the reference current is completed with the above-mentioned steps. However, there is a little current leaking from gate nodes of the drive transistors 101 to 103, it is necessary to repeat the setting of the reference current (periodically or not periodically).

After the completion of setting the reference current, digital voltage signals corresponding to video signals are inputted from the digital signal input lines 151 to 153. The digital signal input lines 151 to 153 correspond to a data input portion of a current output DA converter circuit 192. The total current of the current sources for all the bits whose DA switch is in an ON state is finally outputted from the output portion 182 since the DA switch transistors 161 to 163 are disposed in parallel. In this manner, digital voltage data is converted into an analog current.

In the current output DA converter circuit 192 shown in FIG. 1, if there is variation in the electrical characteristics such as the threshold voltages and the field effect mobility of the drive transistors 101 to 103, the display with middle gradation may be inaccurate. However, the above-mentioned setting of the reference current ensures the accurate display with maximum gradation.

In the current output DA converter circuit 192 shown in FIG. 1, the reference currents for all bits are set at a same time. Therefore, compared to the case in FIG. 7, which needs to set each bit, the complexity is cancelled.

Shown in FIG. 1 is an example of a DA converter circuit which reads in digital voltage value data of a three-bit-constitution and outputs analog current value data. However, for the case of reading in digital voltage value data of N-bit-constitution (N is the arbitrary integer number not less than 2), the similar configuration can be employed.

The drive transistors 101 to 103 are n-channel types and 181 is a low voltage source in FIG. 1. However, the same configuration can be also employed for the case where the drive transistors 101 to 103 are p-channel types and 181 is high voltage source. Furthermore, other configurations can be employed as long as they include a current output circuit including a plurality of drive transistors wherein gate electrodes are electrically connected to each other and a switch is provided between the gate electrode and each drain of the plurality of drive transistors.

At the outside of the panel, it is the most convenient that video data is processed as digital voltage data. In view of the foregoing, the current output DA converter circuit 192 (shown in FIG. 1) and 335 (shown in FIG. 3) in the current data output circuit shown in FIG. 3 is of significance.

However, for example, when the analog current to be outputted is 0 or very small, a long setting time is required. It is not possible to overcome this inconvenience only by the current output DA converter circuit shown in FIG. 1.

A voltage output function of the present invention is useful for this case. The operation for outputting voltages by using voltage source switch transistors 331 to 333 is described below.

Reference number 334 shown in FIG. 3 denotes a constant voltage source (a constant voltage line). The current output DA converter circuit shown in FIG. 1 is a current output circuit for low voltage, so in the case where the voltage to be outputted is high, the analog current to be outputted becomes 0. Therefore, it is convenient to use 334 as the constant voltage for high voltage. In addition, by employing p-channel types for the voltage source switch transistors 331 to 333 and connecting them in series, the voltage may be outputted only when the digital voltage data take low for all bit.

Although the voltage source switch transistors 331 to 333 are p-channel types in FIG. 3, but not always limited to this. Naturally, n-channel types may be employed as needed.

In addition, other configurations may be employed for the voltage source switch transistors 331 to 333.

Figure 10:
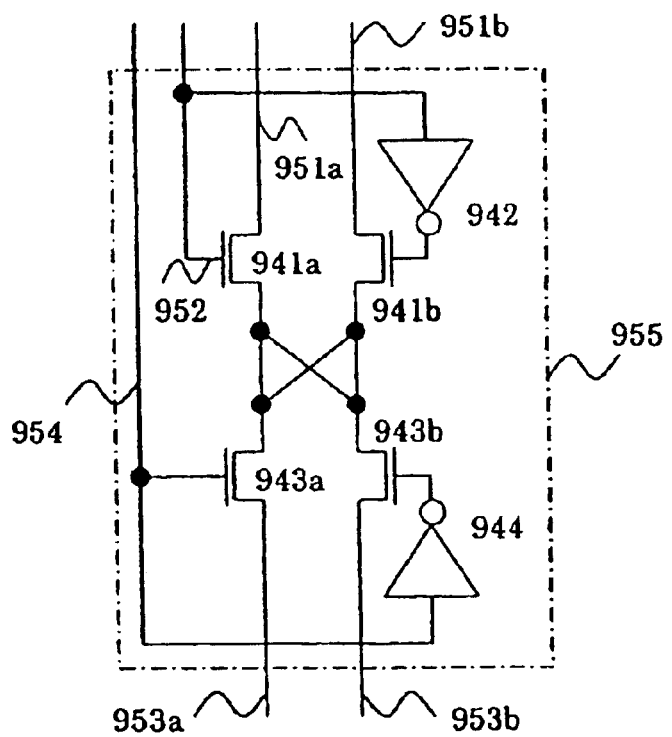
FIG. 10 is a diagram showing an example of a selector circuit.

Summarizing the above, there was an explanation about 342 which corresponds to the current data output circuits 912a and 912b. Next, the selector circuit 913 is described below. A circuit configuration is shown in FIG. 10 (955) as a concrete example of the selector circuit 913, but not always limited to this.

The selector circuit 913 shown in FIG. 9 switches an output node of the current data output circuit 912a or 912b to data line 914a or 914b. In FIG. 9, the ratio of the number of current data output circuits to the number of data lines is 2 to 2 per selector circuit. However, other ratios are generally acceptable. It is an essential point here that a plurality of current data output circuits are provided per selector circuit.

By providing a plurality of current data output circuits per selector circuit, it becomes possible to set a reference current at a current source (a dotted part 191 shown in FIG. 1) in one current data output circuit while the other current data output circuits output data. Consequently, time is utilized efficiently.

For example, the current data output circuit 912b may output data while a reference current is set in the current data output circuit 912a at odd frames. Conversely, the current data output circuit 912a may output data while a reference current is set in the current data output circuit 912b at even frames. Accordingly, a period for setting a reference current and a period for outputting data do not need to be provided individually. In this manner, the efficient use of time can be achieved.

The selector circuit 913 shown in FIG. 9 is advantageous in view of the foregoing although not necessarily required for the present invention. Another configuration may be employed instead of the one shown in FIG. 9.

Embodiment Mode 2

Another embodiment of the present invention is explained below with reference to FIGS. 5, 3, 4 and 2. In this embodiment, a DA converter circuit of the present invention is used in a data driver circuit of an AM type OLED display device. 3-bit digital voltage value data is read in as video data here, however, needless to say, there is no limitation in the number of bits processed in the DA converter circuit of the present invention. Note that, it is possible to substitute a circuit shown in FIG. 1 or FIG. 7 for a circuit shown in FIG. 2.

Figure 5:
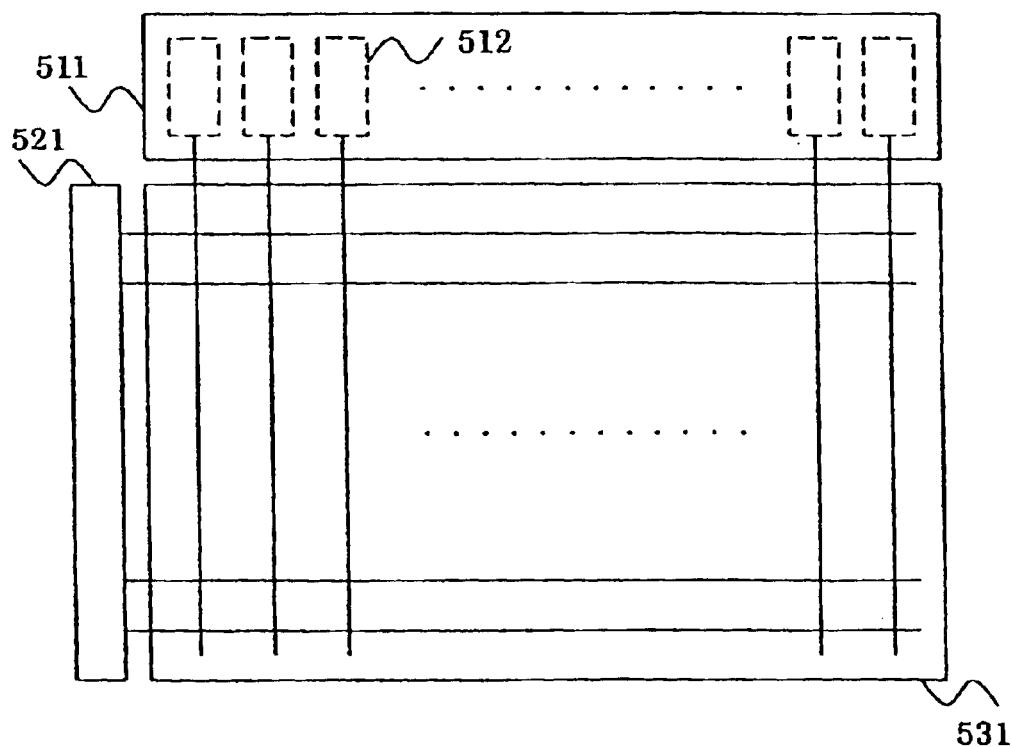
FIG. 5 is a diagram showing a panel configuration example of a display device.

FIG. 5 is a configuration diagram of an entire panel. A pixel portion 531 which has pixels disposed in matrix, a gate driver circuit 521 and a data driver circuit 511 are integrally formed over a panel. A dotted lined part 512 denotes a current data output circuit, whose configuration is shown by a dotted lined part 342 in FIG. 3. Note that, in this embodiment, a data driver circuit including selector circuits such as shown in FIG. 9 may be employed instead of FIG. 5. However, for a simple explanation, the entire panel configuration shown in FIG. 5 is employed here.

Described below is 342 which corresponds to the current data output circuit 512.

The current data output circuit 342 is roughly divided into the following five parts: a shift register part, a digital data latch part, a current source (current output circuit), a DA switch and a voltage source switch. The current source (current output circuit) and the DA switch jointly constitute a current output DA converter circuit.

Reference numbers 301 to 303 correspond to the shift register part and 303 denotes clock and its inverted clock signal lines. The checker parts 301 and 302 comprise for example, a circuit 403 shown in FIG. 4. Note that, configurations of the checker parts 301 and 302 are not limited to the circuit 403. Other circuits can be substituted as long as they can implement the same functions.

The shift register part 301 to 303 output and generate a timing signal sequentially and in accordance with the timing signal, the digital data latch part read in video data (digital data) from data signal lines.

Reference numbers 311 to 318 correspond to the digital data latch part. 317 is data signal lines for each bit, and 318 is a latch signal line. Checker parts 315 and 316 can use the circuit 403 shown in FIG. 4. In FIG. 3, there are three data signal lines on the assumption that video data (digital data) is of three-bit-constitution. The checker parts 315 and 316 in 312 and 313 are omitted from the figure. The video data (digital data) read in in accordance with the timing signal from the digital data latch part is transferred to the DA switch 321 to 323 in synchronism with a latch signal.

Figure 2:
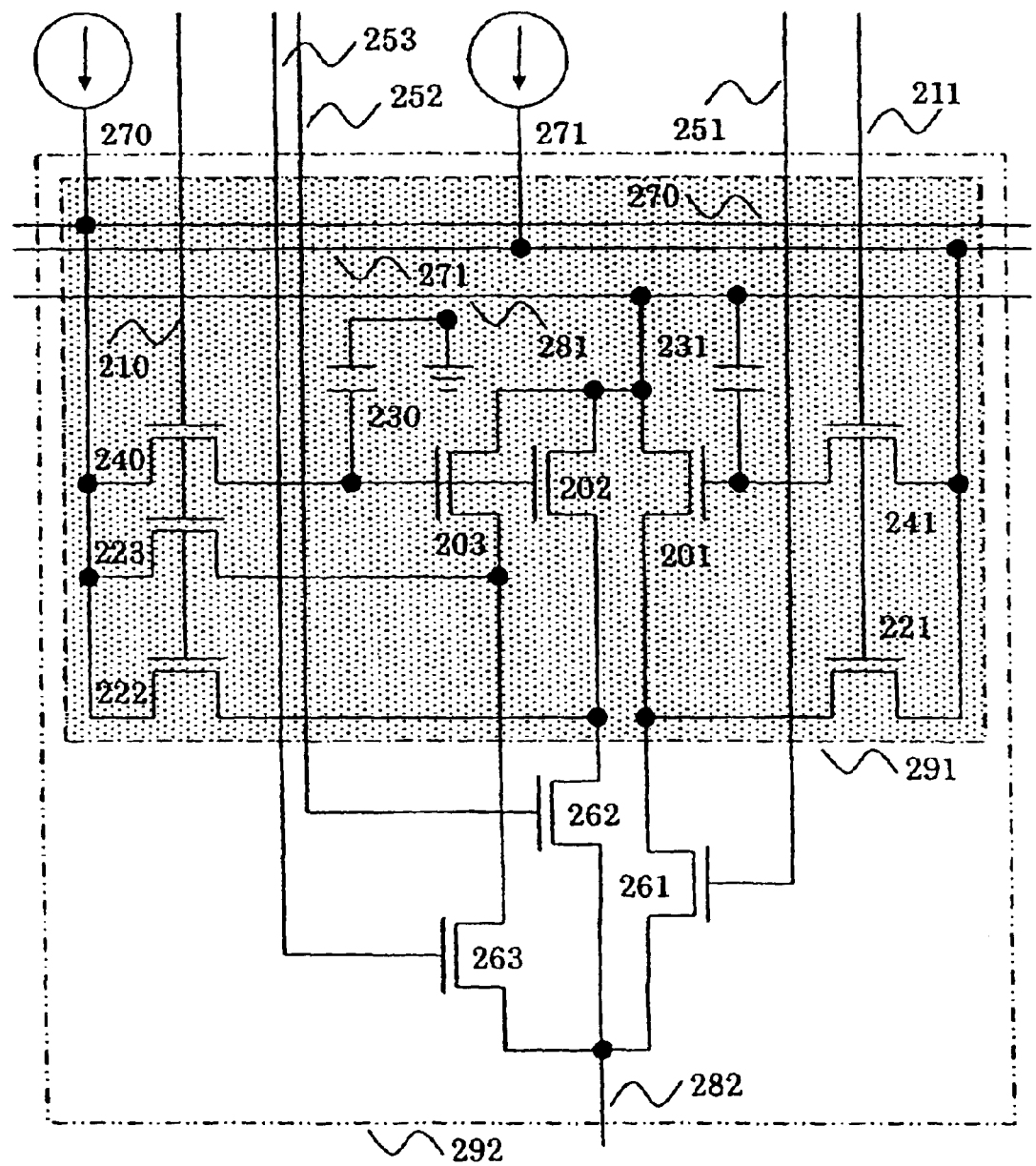
FIG. 2 is a diagram showing an example of a current output circuit and a DA converter circuit.

A dotted part 324 corresponds to the current source (current output circuit) and its specific circuit configuration is shown by a dotted part 291 in FIG. 2.

Transistors 201 to 203 are drive transistors. Transistors 261 to 263 denote DA switch transistors corresponding to 321 to 323 in FIG. 3.

The drive transistor corresponding to each bit is provided independently in FIG. 2. For example, it is supposed that a transistor 201 denotes the one for a first bit (MSB), 202 for a second bit, and 203 for a third bit (LSB), and the L/W size ratio of the three transistors is preferably set at 1:2:4, respectively. That is to say, the L/W size ratio of the drive transistors is preferably set at $2^0:2^1: \ldots :2^{n-1}$ (N is the arbitrary integer number not less than 2) by raising to a power of binary.

Each gate electrode of the drive transistors 202 and 203 is electrically connected to each other, so it makes possible to set reference currents at a same time. The circuit shown in FIG. 2 is different from the circuit shown in FIG. 7 in this point. Furthermore, the reduction in a circuit area can be achieved by the circuit shown in FIG. 2 since the circuit in FIG. 2 has less transistors and wirings than the circuit in FIG. 7.

A gate electrode of the drive transistor 201 is not electrically connected to the gate electrode of 202 and 203. The circuit shown in FIG. 2 is also different from the circuit shown in FIG. 1 in this point. In the circuit shown in FIG. 2, a reference current for the drive transistor 201 for the first bit (MSB) is set independently of those for the other bits. Therefore, the exactness of the current value of MSB data thus is attained.

The operation for setting a reference current at a current source (current output circuit) shown in FIG. 2 is explained below.

For setting a reference current, signals which turn the transistors 261 to 263 OFF are inputted from digital signal input lines 251 to 253. In the case where the transistors 261 to 263 are n-channel types, Low (low voltage) signals are inputted. However, the transistors 261 to 263 are not required to be turned OFF in the case where there is no possibility of a current leaking from an output portion 282 such as a case where an end of the output portion 282 is electrically released (in high impedance).

Next, signals which turn transistors 222, 223 and 240 ON are inputted from a current-setting signal input line 210. In the case where the transistors are n-channel types, Hi (high voltage) signals are inputted. Then, a reference current flows from a reference current source 270 to a constant voltage source 281. At this time, gates and drains of the drive transistors 202 and 203 are each short-circuited. Therefore, by inputting signals which turn the transistors 222, 223 and 240 OFF from the current-setting signal input line 210 after the current reaches a stationary value, the reference current for the second and third bits is stored as the gate voltages of the drive transistors 202 and 203.

At the same or another timing, signals which turn transistors 221 and 241 ON are inputted from a current-setting signal input line 211. In the case where the transistors are n-channel types, Hi (high voltage) signals are inputted. Then, a reference current flows from a reference current source 271 to the constant voltage source 281. At this time, a gate and drain of the drive transistor 201 are short-circuited. Therefore, by inputting signals which turn the transistors 221 and 241 OFF from the current-setting signal input line 211 after the current reaches a stationary value, the reference current for the first bit (MSB) is stored as the gate voltage of the drive transistor 201.

The setting of the reference current is completed with the above-mentioned steps. However, there is a little current leaking from gate nodes of the drive transistors 201 to 203, it is necessary to repeat the setting of the reference current (periodically or not periodically).

After the completion of setting the reference current, digital voltage signals corresponding to video signals are inputted from the digital signal input lines 251 to 253. The digital signal input lines 251 to 253 correspond to a data input portion of a current output DA converter circuit 192. The total current of the current sources for all the bits whose DA switch is in an ON state is finally outputted from the output portion 282 since the DA switch transistors 261 to 263 are disposed in parallel. In this manner, digital voltage data is converted into an analog current.

In the current output DA converter circuit 292 shown in FIG. 2, if there is variation in the electrical characteristics such as the threshold voltages and the field effect mobility of the drive transistors 202 and 203, the display with middle gradation may be inaccurate. However, the above-mentioned setting of the reference current ensures the accurate display with maximum gradation and with middle gradation of MSB.

In the current output DA converter circuit 292 shown in FIG. 2, reference currents for the second and third bits are set at a same time. Therefore, compared to the case in FIG. 7, which needs to set each bit, the complexity is cancelled.

Shown in FIG. 2 is an example of a DA converter circuit which reads in digital voltage value data of a three bits constitution and outputs analog current value data. However, for the case of reading in digital voltage value data of N-bit-constitution (N is the arbitrary integer number not less than 2), the similar configuration can be employed.

The drive transistors 201 to 203 are n-channel types and 281 is a low voltage source in FIG. 2. However, the same configuration can be also employed for the case where the drive transistors 201 to 203 are p-channel types and 281 is a high voltage source. In addition, other configurations can be employed as long as they include a current output circuit including a plurality of drive transistors wherein gate electrodes are electrically connected to each other and a switch is provided between the gate electrode and each drain of the plurality of drive transistors.

A position of the transistor 240 and connection nodes of a capacitor 230 are not limited to the one shown in the example of FIG. 2. For example, the arrangement similar to the one shown in FIG. 1 may be employed. It is only required to store a voltage between sources and gates of the drive transistors 202 and 203 in setting a reference current.

In addition, the structure of an example of FIG. 2 is the same as the one shown in an example of FIG. 1 for two bits and for the other one bit the reference current is set independently. However, a structure that for p bits are the same as the one shown in an example of FIG. 1 and for the other q bits reference currents are set independently (p and q are arbitrary integer numbers not less than 2) may be employed. Further, one for x bits may be the same structure as shown in an example of FIG. 1 and the other for y bits may be the same structure as shown in an example of FIG. 1 independent of it (x and y are the arbitrary integer numbers not less than 2).

At the outside of the panel, it is the most convenient that video data is processed as digital voltage data. In view of the foregoing, the current output DA converter circuit 292 (shown in FIG. 2) and 335 (shown in FIG. 3) in the current data output circuit shown in FIG. 3 is of significance.

However, when the analog current to be outputted is 0 or very small, a long setting time is required. It is not possible to overcome this inconvenience only by the current output DA converter circuit shown in FIG. 1.

A voltage output function of the present invention is useful for this case. The operation for outputting voltages by using voltage source switch transistors 331 to 333 is described below.

Reference number 334 shown in FIG. 3 denotes a constant voltage source (a constant voltage line). The current output DA converter circuit shown in FIG. 1 is a current output circuit for a low voltage, so in the case where the voltage to be outputted is high, the analog current to be outputted becomes 0. Therefore, it is convenient to use 334 as the constant voltage for high voltage. In addition, by employing p-channel types for the voltage source switch transistors 331 to 333 and connecting them in series, the voltage may be outputted only when the digital voltage data take low for all bit.

Although the voltage source switch transistors 331 to 333 are p-channel types in FIG. 3, but not always limited to this. Naturally, n-channel types may be employed as needed.

In addition, other configurations may be employed for the voltage source switch transistors 331 to 333.

Summarizing the above, there was an explanation about 342 which corresponds to the current data output circuit 512.

Embodiment Mode 3

Another embodiment of the present invention is explained below with reference to FIGS. 5, 11, 4 and 2. In this embodiment, a DA converter circuit of the present invention is used in a data driver circuit of an AM type OLED display device. 3-bit digital voltage value data is read in as video data here, however, needless to say, there is no limitation in the number of bits processed in the DA converter circuit of the present invention. Note that, it is possible to substitute a circuit shown in FIG. 1 or FIG. 7 for a circuit shown in FIG. 2.

FIG. 5 is a configuration diagram of an entire panel. A pixel portion 531 which has pixels disposed in matrix, a gate driver circuit 521 and a data driver circuit 511 are integrally formed over a panel. A dotted lined part 512 denotes a current data output circuit, whose configuration is shown by a dotted lined part 1342 in FIG. 11. Note that, in this embodiment, a data driver circuit including selector circuits such as shown in FIG. 9 may be employed instead of FIG.

5. However, for a simple explanation, the entire panel configuration shown in FIG. 5 is employed here.

Described below is 1342 which corresponds to the current data output circuit 512.

The current data output circuit 342 in FIG. 3 is roughly divided into the following five parts: a shift register part, a digital data latch part, a current source (current output circuit), a DA switch and a voltage source switch. The current source (current output circuit) and the DA switch jointly constitute a current output DA converter circuit.

Reference numbers 1301 to 1303 correspond to the shift register part and 1303 denotes clock and its inverted clock signal lines. The checker parts 1301 and 1302 comprise for example, a circuit 403 shown in FIG. 4. Note that, configurations of the checker parts 301 and 302 are not limited to the circuit 403. Other circuits can be substituted as long as they can implement the same functions.

The shift register part 301 to 303 output and generate a timing signal sequentially and in accordance with the timing signal, the digital data latch part read in video data (digital data) from data signal lines.

Figure 11:
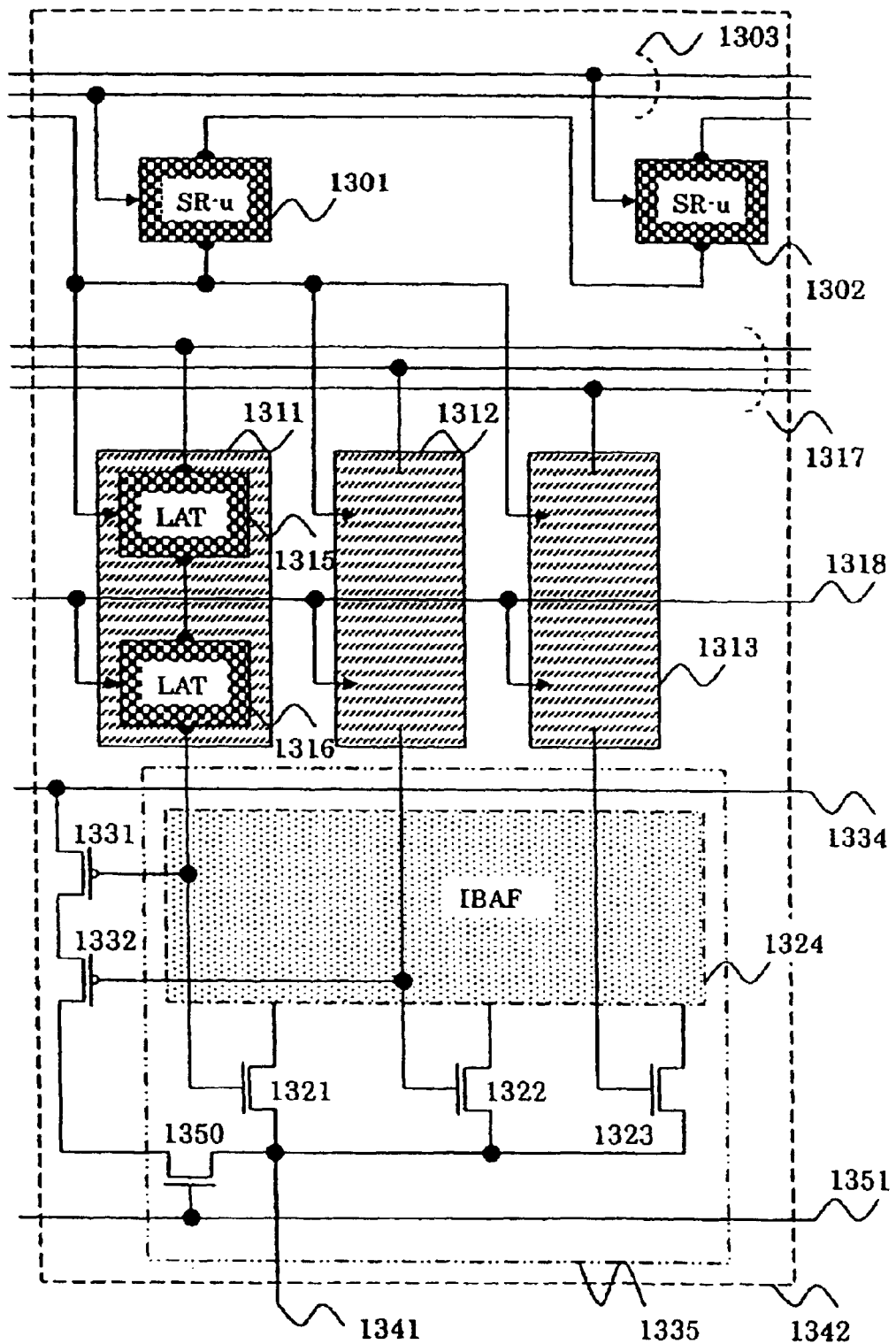
FIG. 11 is a diagram showing a configuration example of a data driver using a DA converter circuit of the present invention.

Reference numbers 1311 to 1318 correspond to the digital data latch part including data signal lines 1317 for each bit, a latch signal line 1318, and checker parts 1315 and 1316. For the checker parts 1315 and 1316, a circuit 403 shown in FIG. 4 can be used. In FIG. 11, there are three data signal lines on the assumption that video data (digital data) is of three-bit-constitution, and circuits corresponding to the checker parts 1315 and 1316 in 1312 and 1313 are omitted from the figure. The video data (digital data) read in in accordance with the timing signal from the digital data latch part is transferred to the DA switch 1321 to 1323 in synchronism with a latch signal.

A dotted part 1324 corresponds to the current source (current output circuit) and its specific circuit configuration is shown by a dotted part 291 in FIG. 2.

Transistors 201 to 203 are drive transistors. Transistors 261 to 263 denote DA switch transistors corresponding to 1321 to 1323 in FIG. 11.

The drive transistor corresponding to each bit is provided independently in FIG. 2. For example, it is supposed that a transistor 201 denotes the one for a first bit (MSB), 202 for a second bit, and 203 for a third bit (LSB), and the L/W size ratio of the three transistors is preferably set at 1:2:4, respectively. That is to say, the L/W size ratio of the drive transistors is preferably set at $2^0:2^1: \ldots :2^{n-1}$ (N is the arbitrary integer number not less than 2) by raising to a power of binary.

Each gate electrode of the drive transistors 202 and 203 is electrically connected to each other, so it makes possible to set reference currents for the drive transistors at a same time. The circuit shown in FIG. 2 is different from the circuit shown in FIG. 7 in this point. Furthermore, the reduction in a circuit area can be achieved by the circuit shown in FIG. 2 since the circuit in FIG. 2 has less transistors and wirings than the circuit in FIG. 7.

A gate electrode of the drive transistor 201 is not electrically connected to the gate electrode of the drive transistors 202 and 203. The circuit shown in FIG. 2 is also different from the circuit shown in FIG. 1 in this point. In the circuit shown in FIG. 2, a reference current for the drive transistor 201 for the first bit (MSB) is set independently of those for the other bits. Therefore, the exactness of the current value of MSB data thus is attained.

The operation for setting a reference current at a current source (current output circuit) shown in FIG. 2 is explained below.

For setting a reference current, signals which turn the transistors 261 to 263 OFF are inputted from digital signal input lines 251 to 253. In the case where the transistors 261 to 263 are n-channel types, Low (low voltage) signals are inputted. However, the transistors 261 to 263 are not required to be turned OFF in the case where there is no possibility of a current leaking from an output portion 282 such as a case where an end of the output portion 282 is electrically released (in high impedance).

Next, signals which turn transistors 222, 223 and 240 ON are inputted from a current-setting signal input line 210. In the case where the transistors are n-channel types, Hi (high voltage) signals are inputted. Then, a reference current flows from a reference current source 270 to a constant voltage source 281. At this time, gates and drains of the drive transistors 202 and 203 are each short-circuited. Therefore, by inputting signals which turn the transistors 222, 223 and 240 OFF from the current-setting signal input line 210 after the current reaches a stationary value, the reference current for the second and third bits is stored as the gate voltages of the drive transistors 202 and 203.

At the same or another timing, signals which turn transistors 221 and 241 ON are inputted from a current-setting signal input line 211. In the case where the transistors are n-channel types, Hi (high voltage) signals are inputted. Then, a reference current flows from a reference current source 271 to the constant voltage source 281. At this time, a gate and drain of the drive transistor 201 are short-circuited. Therefore, by inputting signals which turn the transistors 221 and 241 OFF from the current-setting signal input line 211 after the current reaches a stationary value, the reference current for the first bit (MSB) is stored as the gate voltage of the drive transistor 201.

The setting of the reference current is completed with the above-mentioned steps. However, there is a little current leaking from gate nodes of the drive transistors 201 to 203, it is necessary to repeat the setting of the reference current (periodically or not periodically).

After the completion of setting the reference current, digital voltage signals corresponding to video signals are inputted from the digital signal input lines 251 to 253. The digital signal input lines 251 to 253 correspond to a data input portion of a current output DA converter circuit 292. The total current of the current sources for all the bits whose DA switch is in an ON state is finally outputted from the output portion 282 since the DA switch transistors 261 to 263 are disposed in parallel. In this manner, digital voltage data is converted into an analog current.

In the current output DA converter circuit 292 shown in FIG. 2, if there is variation in the electrical characteristics such as the threshold voltages and the field effect mobility of the drive transistors 202 and 203, the display with middle gradation may be inaccurate. However, the above-mentioned setting of the reference current ensures the accurate display with maximum gradation and with middle gradation of MSB.

In the current output DA converter circuit 292 shown in FIG. 2, reference currents for the second and third bits are set at a same time. Therefore, compared to the case in FIG. 7, which needs to set each bit, the complexity is cancelled.

Shown in FIG. 2 is an example of a DA converter circuit which reads in digital voltage value data of a three bits constitution and outputs analog current value data. However, for the case of reading in digital voltage value data of N-bit-constitution (N is the arbitrary integer number not less than 2), the similar configuration can be employed.

The drive transistors 201 to 203 are n-channel types and 281 is a low voltage source in FIG. 2. However, the same configuration can be also employed for the case where the drive transistors 201 to 203 are p-channel types and 281 is high voltage source. In addition, other configurations can be employed as long as they include a current output circuit including a plurality of drive transistors wherein gate electrodes are electrically connected to each other and a switch is provided between the gate electrode and each drain of the plurality of drive transistors.

A position of the transistor 240 and connection nodes of a capacitor 230 are not limited to the one shown in the example of FIG. 2. For example, the arrangement similar to the one shown in FIG. 1 may be employed. It is only required to store a voltage between sources and gates of the drive transistors 202 and 203 in setting a reference current.

The structure of the example shown in FIG. 2 is that for two bits are the same as the one shown in FIG. 1 and for the other one bit the reference current is set independently. However, a structure that for p bits are the same as the one shown in FIG. 1 and for the other q bits reference currents are set independently (p and q are arbitrary integer numbers not less than 2) may be employed. Further, one for x bits may be the same structure as shown in FIG. 1 and the other for y bits may be the same structure as shown in FIG. 1, independent of it (x and y are the arbitrary integer numbers not less than 2).

At the outside of the panel, it is the most convenient that video data is processed as digital voltage data. In view of the foregoing, the current output DA converter circuit 292 (shown in FIG. 2) and 1335 (shown in FIG. 11) in the current data output circuit shown in FIG. 11 is of significance.

However, when the analog current to be outputted is 0 or very small, a long setting time is required. It is not possible to overcome this inconvenience only by the current output DA converter circuit shown in FIG. 1.

A voltage output function of the present invention is useful for this case. The operation for outputting voltages by using voltage source switch transistors 1331, 1332 and 1350 is described below.

Reference number 1334 shown in FIG. 11 denotes a constant voltage source (a constant voltage line). The current output DA converter circuit shown in FIG. 1 is a current output circuit for a low voltage, so in the case where the voltage to be outputted is high, the analog current to be outputted becomes 0. Therefore, it is convenient to use the 1334 as the constant voltage for high voltage. In addition, by employing p-channel types for the voltage source switch transistors 1331 and 1332 and connecting them in series, the voltage may be outputted only when the digital voltage data take low for all bit.

The transistor 1350, whose ON/OFF operation is controlled by a signal of a control line 1351, is provided in series to the transistors 1331 and 1332. The circuit shown in FIG. 11 is different from the one shown in FIG. 3 in this point. By the signal of the control line 1351 in FIG. 11, the period for short-circuiting the constant voltage line 1334 and an output portion 1341 can be limited to a certain period. By the above-mentioned function, it is possible to maintain a configuration of outputting an analog current finally regardless of a value of digital voltage data.

That is, in the configuration of FIG. 3, in the case where the digital voltage data takes a predetermined value (low signal at all of the bit data), the output is performed only by voltage from the constant voltage source 1334, no longer by current. On the other hand, in the configuration of FIG. 11, it is possible to turn the transistor 1350 ON in the beginning for the constant voltage line 1334 and the output portion 1341 to be short-circuited and after that turn the transistor 1350 OFF. Thus an analog current value determines the output in the end. The constant voltage source 1334 only supports the output.

It is especially advantageous in the case where an analog current to be outputted is a very small value but not 0 that the last output is an analog current value, not a voltage from the constant voltage source 1334.

When a current is very small, it takes long time to reach the stationary output state. Provided that an analog current to be outputted is 0, length of the time can be shortened by flowing a large current by converting to a voltage output. Provided the current is not 0, however, it is desirable to avoid the complete conversion to the voltage output as it increases the error in the output a great deal. Nevertheless, it is still essential to flow a large current by voltage-assignment in order to reduce the time to reach the stationary output state. Therefore, in the case where the current to be outputted is little but not 0, it is advantageous to flow a large current by voltage-assignment and finally to realize an accurate output by a current.

Although the voltage source switch transistors 1331 and 1332 are p-channel types and 1350 is n-channel type in FIG. 11, there is no limitation for this. Another combination of channel types may be employed.

In addition, other configurations than the transistors 1331, 1332 and 1350 may be employed for the voltage source switch.

Described above is about 1342 which corresponds to the current data output circuit 512.

Embodiment Mode 4

In Embodiment Mode 4, display devices or electronic equipment of the present invention will be exemplified.

Examples of electronic equipment and the display devices of the present invention include monitors, video cameras, digital cameras, goggle type displays (head mounted displays), navigation systems, audio reproduction devices (audio components, car audios, etc.), notebook type personal computers, game machines, portable information terminals (mobile computers, mobile telephones, portable game machines, and electronic books, etc.), image reproduction devices equipped with a recording medium (specifically, devices equipped with a display capable of reproducing the recording medium such as a digital versatile disk (DVD), etc. and displaying the image thereof) and the like, and display devices mounted on these electronic equipment. Specific examples of these electronic equipment are shown in FIG. 6.

Figure 6A:
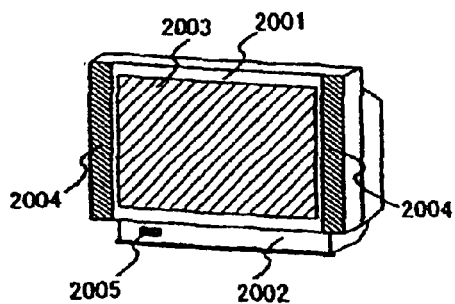
FIGS. 6A to 6H are views showing examples of a display device and electronic equipment.

FIG. 6A is a monitor which, in this example, is composed of a housing 2001, a support base 2002, a display portion 2003, a speaker portion 2004, a video input terminal 2005, and the like. The display device of the present invention can be used in the display portion 2003. Note that, the term monitor includes all the display devices for displaying information, used for personal computers, receiving TV broadcasting, advertising, and the like.

Figure 6B:
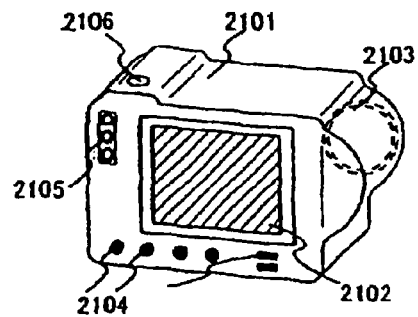

FIG. 6B is a digital still camera which, in this example, is composed of a main body 2101, a display portion 2102, an image-receiving portion 2103, operation keys 2104, an external connection port 2105, a shutter 2106, and the like. The display device of the present invention can be used in the display portion 2102.

Figure 6C:
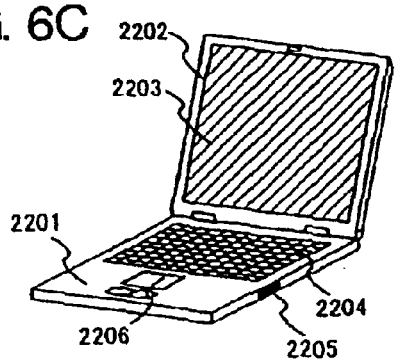

FIG. 6C is a notebook type personal computer which, in this example, is composed of a main body 2201, a housing 2202, a display portion 2203, a keyboard 2204, an external connection port 2205, a pointing mouse 2206, and the like. The display device of the present invention can be used in the display portion 2203.

Figure 6D:
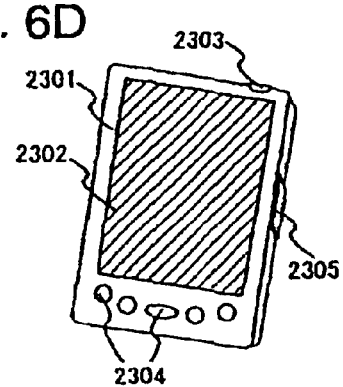

FIG. 6D is a mobile computer which, in this example, is composed of a main body 2301, a display portion 2302, a switch 2303, operation keys 2304, an infrared port 2305, and the like. The display device of the present invention can be used in the display portion 2302.

Figure 6E:
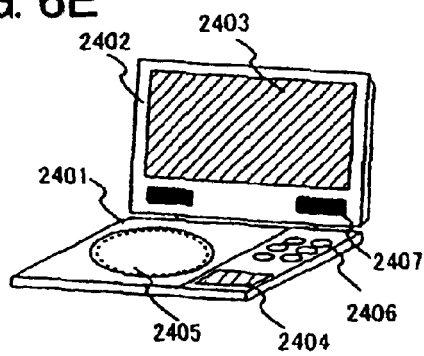

FIG. 6E is a portable image reproduction device provided with a recording medium (specifically, a DVD reproduction device) which, in this example, is composed of a main body 2401, a housing 2402, a display portion A 2403, a display portion B 2404, a recording medium (such as a DVD) read-in portion 2405, operation keys 2406, a speaker portion 2407, and the like. The display device of the present invention can be used in the display portion A 2403 and in the display portion B 2404. Note that, the term image reproduction device provided with a recording medium includes game machines for domestic use and the like.

Figure 6F:
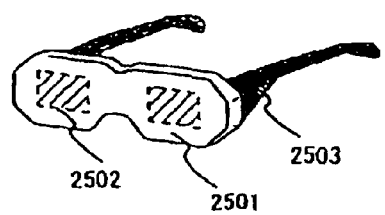

FIG. 6F is a goggle type display (a head mounted display) which, in this example, is composed of a main body 2501, a display portion 2502, an arm 2503, and the like. The display device of the present invention can be used in the display portion 2502.

Figure 6G:
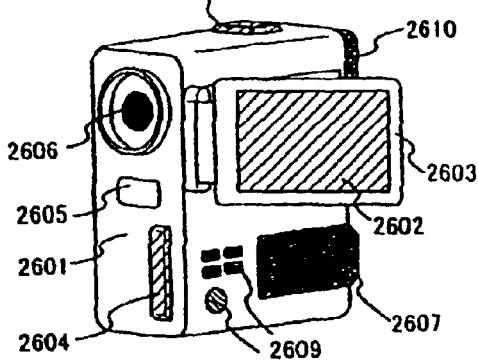

FIG. 6G is a video camera which, in this example, is composed of a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. The display device of the present invention can be used in the display portion 2602.

Figure 6H:
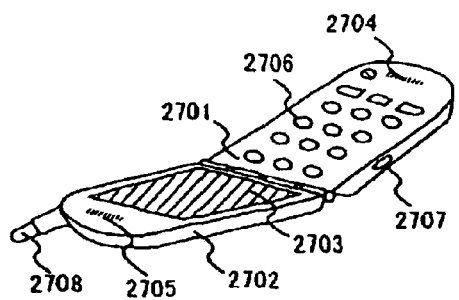

FIG. 6H is a mobile telephone which, in this example, is composed of a main body 2701, a housing 2702, a display portion 2703, an audio input portion 2704, an audio output portion 2705, operation keys 2706, an external connection port 2707, an antenna 2708, and the like. The display device of the present invention can be used in the display portion 2703. Note that, by displaying white characters on a black background in the display portion 2703, the power consumption of the mobile telephone can be saved.

As has been described, the application range of the present invention is so wide that it is possible to use the present invention in electronic equipment and the like of any field.

The invention shortens the time required for data output in the case where an extremely small current of data is to be outputted in a DA converter circuit which reads in a digital voltage value data and outputs a analog current value data.

The invention can be employed for a data driver circuit and the like used in an AM type OLED display device.

What is claimed is:

1. A current output DA converter circuit comprising:

a current output circuit;

a voltage source;

a data input portion; and an output portion, characterized in that digital data is inputted to the data input portion;

a constant voltage is applied from the voltage source to the output portion in the case where the data in the data input portion takes a predetermined value; and a current corresponding to a value of the data in the data input portion is applied from the current output circuit to the output portion in other cases, wherein:

the current output circuit includes a plurality of drive transistors; and each gate electrode of the plural drive transistors is electrically connected to each other and a switch is provided between the gate electrode and each drain electrode of the plural drive transistors.

2. A current output DA converter circuit comprising:

a current output circuit;

a voltage source;

a data input portion; and an output portion, characterized in that a plurality of switches are provided in series between the voltage source and the output portion;

digital data is inputted to the data input portion; and all of the plural switches are turned ON in the case where bit data in the data input portion takes a predetermined value, wherein:

the current output circuit includes a plurality of drive transistors; and each gate electrode of the plural drive transistors is electrically connected to each other and a switch is provided between the gate electrode and each drain electrode of the plural drive transistors.

3. A current output DA converter circuit comprising:

a current output circuit;

a voltage source;

a data input portion; and an output portion, characterized in that digital data is inputted to the data input portion;

a current corresponding to a value of the data in the data input portion is applied from the current output circuit to the output portion; and the voltage source and the output portion are short-circuited for a certain period in the case where the data in the data input portion takes a predetermined value, wherein:

the current output circuit includes a plurality of drive transistors; and each gate electrode of the plural drive transistors is electrically connected to each other and a switch is provided between the gate electrode and each drain electrode of the plural drive transistors.

* * * * *